United States Patent
Gabric et al.

[11] Patent Number: 5,837,611
[45] Date of Patent: Nov. 17, 1998

[54] PRODUCTION METHOD FOR AN INSULATION LAYER FUNCTIONING AS AN INTERMETAL DIELECTRIC

[75] Inventors: Zvonimir Gabric, Zorneding; Oswald Spindler, Vaterstetten; Thomas Grassl, Freising, all of Germany

[73] Assignee: Siemens Aktiengesellschaft, Munich, Germany

[21] Appl. No.: 907,210

[22] Filed: Aug. 6, 1997

[30] Foreign Application Priority Data

Aug. 6, 1996 [DE] Germany .................. 196 31 743.6

[51] Int. Cl.$^6$ .................................................. H01L 21/00
[52] U.S. Cl. .................. 438/692; 216/38; 216/88
[58] Field of Search .................. 438/626, 633, 438/692, 697, 723, 743, 756, 747; 216/38, 88, 99

[56] References Cited

U.S. PATENT DOCUMENTS

| | | | |
|---|---|---|---|
| 5,674,784 | 10/1997 | Jang et al. | 438/692 |
| 5,702,980 | 12/1997 | Yu et al. | 438/692 |

FOREIGN PATENT DOCUMENTS

| | | |
|---|---|---|
| 0527001A1 | 2/1993 | European Pat. Off. . |
| 0 537 001 A1 | 4/1993 | European Pat. Off. . |
| 4-214630 | 8/1992 | Japan . |

OTHER PUBLICATIONS

Global Planarization by Selective Deposition of Ozone/TEOS, E. Fischer et al., Siemens AG, Components Group, München, Germany.

Applications of APCVD TEOS/$O_3$ thin films in ULSI IC fabrication, H. Wallace Fry et al., Solid State Technology, Mar. 1994, pp. 31–40.

*Primary Examiner*—William Powell
*Attorney, Agent, or Firm*—Herbert L. Lerner; Laurence A. Greenberg

[57] ABSTRACT

When large-scale integrated circuits are produced, pronounced differences in height occur within conductor track levels. Those extreme topographies lead to difficulties during photo-lithographic processes, since there is a direct relationship between resolution and depth of focus. A production method for applying an insulation layer functioning as an intermetal dielectric is based on an ozone-activated selective deposition of silicon oxide. The conductor tracks are completely encapsulated with an insulation layer, so that bulges do not occur above upper edges of the conductor tracks.

9 Claims, 1 Drawing Sheet

PRODUCTION METHOD FOR AN INSULATION LAYER FUNCTIONING AS AN INTERMETAL DIELECTRIC

BACKGROUND OF THE INVENTION

Field of the Invention

The invention relates to a production or fabrication method for an insulation layer functioning as an intermetal dielectric (IMD) on a substrate.

When large-scale integrated circuits are produced, pronounced differences in height occur within conductor track levels. Those extreme fluctuations in topographies lead to enormous difficulties during photolithographic processes, since there is a direct relationship between resolution and depth of focus.

In addition, as the density of integration increases, it becomes increasingly difficult to fill such gaps with intermetal dielectrics in a bubble-free fashion, due to decreasing spaces between the conductor tracks and increasing lateral ratios between the conductor tracks.

Published European Patent Application 0 537 001 A1 discloses a method for fabricating and planarizing an intermetal dielectric on a semiconductor component. A first insulation layer is applied to a substrate surface. The first insulation layer is covered with a metal layer which is then structured through the use of a photographic step to form metal conductor tracks. The metal conductor tracks are then covered on their surfaces with a second insulation layer, and finally a third insulation layer is deposited, through the use of an ozone-activated CVD method, on the substrate which is structured in that way. The first and the second insulation layers are selected in that case in such a way that the rate of growth of the third insulation layer onto the first insulation layer is greater than onto the second insulation layer. It has been found to be a disadvantage with that method that the side edges of the metal conductor tracks are not covered with a conductive barrier layer. The side edges of the metal conductor tracks are usually oxidized, i.e. they are covered with metal oxide. However, the rate of growth onto those metal oxide edges corresponds to the rate of growth onto the first insulation layer, which as a rule is composed of silicon oxide. In that selective deposition of the third insulation layer, bulges occur above upper edges of the metal conductor tracks. The bulges are termed "ears". Such an "ear formation" is of course undesired and has to be removed through the use of a CMP (Chemical Mechanical Polishing) method.

SUMMARY OF THE INVENTION

It is accordingly an object of the invention to provide a production method for an insulation layer functioning as an intermetal dielectric (IMD) on a semiconductor substrate, which overcomes the hereinafore-mentioned disadvantages of the heretofore-known methods of this general type and which provides an insulation layer with which an undesired "ear formation" does not occur or occurs only to a limited degree.

With the foregoing and other objects in view there is provided, in accordance with the invention, a production method for an insulation layer functioning as an intermetal dielectric (IMD) on a substrate, which comprises covering a substrate surface with a first insulation layer; covering the first insulation layer with a metal layer; structuring metal conductor tracks into the metal layer by a photographic step; covering surfaces and side edges of the metal conductor tracks with a second insulation layer; removing the second insulation layer between the metal conductor tracks on the first insulation layer; depositing a third insulation layer by an ozone-activated CVD method onto the structured substrate; and selecting the first insulation layer and the second insulation layer to cause a rate of growth of the third insulation layer onto the first insulation layer to be greater than onto the second insulation layer.

In accordance with another mode of the invention, for fine machining of the substrate surface, the third insulation layer is then planarized through the use of a CMP (Chemical Mechanical Polishing) method.

In accordance with a further mode of the invention, phosphorous silicate glass, borophosphorous silicate glass or undoped silicate glass, which can be deposited through the use of ozone-activated CVD methods, are suitable as the first insulation layer.

In accordance with an added mode of the invention, titanium nitride is deposited as the second insulation layer, which may be carried out through the use of a CVD method or a PECVD method.

In accordance with an additional mode of the invention, TEOS (tetraethylorthosilicate) or OMTC (octamethylcyclotetrasiloxane) or HMDS (hexamethyldisiloxane) are used as starting substances.

In accordance with a concomitant mode of the invention, the metal conductor tracks are formed of aluminum.

Other features which are considered as characteristic for the invention are set forth in the appended claims.

Although the invention is illustrated and described herein as embodied in a production method for an insulation layer functioning as an intermetal dielectric, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
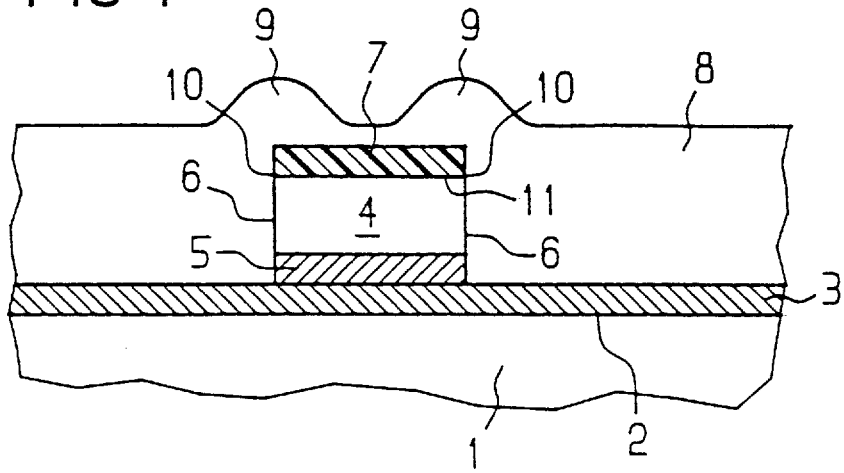
FIG. 1 is a fragmentary, diagrammatic, cross-sectional view of a deposited intermetal dielectric according to the prior art.

Referring now to the figures of the drawings in detail and first, particualrly, to FIG. 1 thereof, there is seen a silicon substrate designated by reference numeral 1. A first insulation layer 3 composed of silicon oxide is applied to a substrate surface 2 of the silicon substrate 1. The first insulation layer 3 is covered with a metal conductor track 4 composed of aluminum. A titanium/titanium nitride layer 5 is introduced between the aluminum conductor track 4 and the first insulation layer 3. The titanium/titanium nitride layer 5 serves as a diffusion barrier and as an adhesive agent between the aluminum conductor track 4 and the insulation layer 3 lying underneath it. A second insulation layer 7 composed of titanium nitride is applied to a surface 11 of the metal conductor track 4.

Side edges 6 of the aluminum conductor track 4 are not provided with any special insulation layer. The side edges 6 of the aluminum conductor track 4 are usually covered with $Al_2O_3$, i.e. they are oxidized on their surface.

A third insulation layer 8 is deposited on the aluminum conductor track 4 through the use of an ozone-activated CVD method. Tetraethylorthosilicate (TEOS) is used in that case as a starting substance for the third insulation layer 8.

The rate of growth of the third insulation layer 8 onto the first insulation layer 3 is significantly greater than onto the titanium nitride layer 7. However, since the side edges of the aluminum conductor track 4 are composed of aluminum oxide in a first approximation, the rate of growth there is more or less equal to the rate of growth onto the first insulation layer 3, so that ear-like bulges 9 are formed above upper edges 10 of the aluminum conductor track 4.

Figure 2:
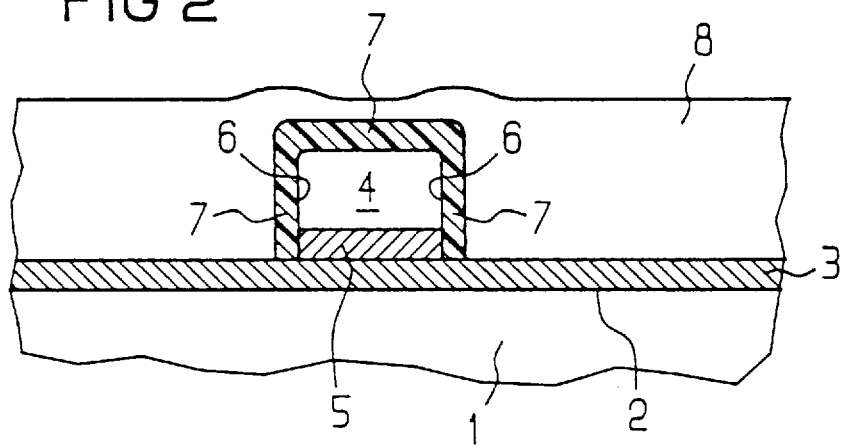
FIG. 2 is a fragmentary, cross-sectional view of a deposited intermetal dielectric in accordance with the present invention.

As can be seen in FIG. 2, the aluminum conductor track 4 is also covered on its side edges 6 with the second insulation layer 7 composed of titanium nitride. The aluminum conductor track 4 is accordingly completely encapsulated with titanium nitride in this case, so that the silicon oxide 8 on the side edges which has been deposited through the use of the ozone-activated CVD method achieves a rate of growth which is just as low as that onto the surface of the aluminum conductor track 4 covered with titanium nitride. As a result, the formation of the ear-like bulges above the upper edges of the aluminum conductor track does not occur.

This encapsulation of the aluminum conductor track 4 with a titanium nitride layer 7 enables a rate of growth on the side edges 6 to be achieved which is so low that spaces between conductor tracks as small as 0.2 μm and lateral ratios (aspect ratios) up to 6 can be filled in a bubble-free fashion.

The ozone-activated CVD method which is used to deposit the third insulation layer 8 takes place under virtually atmospheric pressure and a comparatively large flow of ozone with a high ozone concentration.

We claim:

1. A production method for an insulation layer functioning as an intermetal dielectric (IMD) on a substrate, which comprises:

a) covering a substrate surface with a first insulation layer;

b) covering the first insulation layer with a metal layer;

c) structuring metal conductor tracks into the metal layer by a photographic step;

d) covering surfaces and side edges of the metal conductor tracks with a second insulation layer;

e) removing the second insulation layer between the metal conductor tracks on the first insulation layer;

f) depositing a third insulation layer by an ozone-activated CVD method onto the structured substrate; and g) selecting the first insulation layer and the second insulation layer to cause a rate of growth of the third insulation layer onto the first insulation layer to be greater than onto the second insulation layer.

2. The production method according to claim 1, which comprises then planarizing the third insulation layer by a CMP (Chemical Mechanical Polishing) method.

3. The production method according to claim 1, which comprises depositing a material selected from the group consisting of phosphorous silicate glass, borophosphorous silicate glass and undoped silicate glass as the first insulation layer.

4. The production method according to claim 3, which comprises depositing the first insulation layer by an ozone-activated CVD method.

5. The production method according to claim 1, which comprises depositing titanium nitride as the second insulation layer.

6. The production method according to claim 5, which comprises depositing the titanium nitride layer by a CVD method.

7. The production method according to claim 5, which comprises depositing the titanium nitride layer by a PECVD method.

8. The production method according to claim 1, which comprises selecting a material from the group consisting of TEOS (tetraethylorthosilicate), OMTC (octamethylcyclotetrasiloxane) and HMDS (hexamethyldisiloxane) as a starting substance for the third insulation layer.

9. The production method according to claim 1, which comprises producing the metal conductor tracks of aluminum.

* * * * *